United States Patent
Yeh et al.

[11] Patent Number: 6,008,118
[45] Date of Patent: Dec. 28, 1999

[54] METHOD OF FABRICATING A BARRIER LAYER

[75] Inventors: Wen-Kuan Yeh, Chupei; Tony Lin, Kao Hsiung Hsien; Heng-Sheng Huang, Taipei, all of Taiwan

[73] Assignee: United Microelectronics Corp., Hsin-Chu, Taiwan

[21] Appl. No.: 09/059,310

[22] Filed: Apr. 13, 1998

[30] Foreign Application Priority Data

Dec. 19, 1997 [TW] Taiwan ................................. 86119308

[51] Int. Cl.[6] .............................................. H01L 21/4763
[52] U.S. Cl. .......................... 438/629; 438/528; 438/624; 438/627; 438/653
[58] Field of Search .................................. 438/528, 624, 438/627, 629, 643, 653, 654, 658, 659, 350, 355

[56] References Cited

U.S. PATENT DOCUMENTS

| | | | |
|---|---|---|---|
| 5,354,712 | 10/1994 | Ho et al. | 438/643 |
| 5,633,200 | 5/1997 | Hu | 438/653 |
| 5,780,908 | 7/1998 | Sekiguchi et al. | 257/383 |
| 5,817,572 | 10/1998 | Chiang et al. | 438/624 |
| 5,824,599 | 10/1998 | Schacham-Diamand et al. | 438/678 |
| 5,910,020 | 6/1999 | Yamada | 438/424 |

FOREIGN PATENT DOCUMENTS 405347274  12/1993  Japan ............................. 438/FOR 350

*Primary Examiner*—Carl Whitehead, Jr.
*Assistant Examiner*—Jeff Vockrodt

[57] ABSTRACT

A method of forming a barrier layer is disclosed. The barrier layer is formed on the upper surface of the tungsten plug. The method of forming the barrier layer is mainly a nitridation reaction. The nitridation reaction makes use of $NH_3$ plasma, $N_2$ plasma and $N^+$ implantation.

13 Claims, 3 Drawing Sheets

METHOD OF FABRICATING A BARRIER LAYER

BACKGROUND OF THE INVENTION

1. Field of the Invention

The invention relates in general to the fabrication of a barrier layre, and more particularly to the fabrication of a barrier layer corresponding with a nitridation reaction.

2. Description of the Related Art

The increasing of the integrity of the integrated circuited (IC) causes the insufficiency of the chip surface for formation of interconnection. To satisfy the requirement of more wiring lines as the device size is shrinking, a design of multi-level interconnection is needed for IC fabrication. The multi-level interconnection is a three-dimensional wiring line structure . To form a multi-level interconnection structure, the first or lower layer of the metal wiring line is first formed, connecting with the source/drain region of the metal-oxide semiconductor transistor (MOS) on a substrate and the second layer of the metal wiring line is then formed, connecting with the first metal wiring line. The metal wiring lines can either be made from metal or any conductive material such as polysilicon. More than two layers of metal wiring lines can be formed if necessary.

Aluminum and tungsten are both widely used metal for metallization process of ICs. Aluminum is mainly used as wiring lines between devices due to its low resistivity and aluminum is mostly formed by magnetron DC sputtering. Tungsten is widely used for forming a plug to connect different layers of metal since it can be formed by chemical vapor deposition (CVD), easy to form fluoride compound with high volatility and without etching difficulties. However, spiking tends to occur at the junction of the aluminum and silicon. The solution of spiking is to form a barrier layer made from a conductive material between the aluminum layer and silicon. By forming the barrier layer, the adhesion force of tungsten to other material can be also improved. The barrier layer can be formed from TiN or TiW.

On the other hand, copper has been intensively studied as a new candidate for metal interconnects because of its lower electrical resistivity and better electromigration resistance than aluminum. However, for the successful application of copper metallization, fast diffusivity and high oxidation of copper must be solved. Although several metal nitirides and metal oxides have been investigated to improve these problems, they also increase the complex of metallization process and sheet resistance of copper interconnection line; thus, a stable copper metallization system was not easy to obtain.

Referring to FIG. 1A~1C, a conventional process for forming a barrier layer is shown. As shown in FIG. 1A, a semiconductor device 11 is first formed. Then, referring to FIG. 1B, an oxide layer 12 is deposited to cover the semiconductor device 11 by CVD. Then, by performing a photolithography process, an opening 13 is etched to formed at the oxide layer 12.

Next, referring to FIG. 1C, a barrier layer 14 is deposited to cover the periphery and the bottom of the opening 13. The material of the barrier layer 14 can be TiN. Next, a tungsten plug layer 15 is deposited by CVD to fill the opening 13 and to cover the barrier layer 14. A chemical mechanical polishing (CMP) process is then performed to polish the tungsten plug layer 15 until the surface of the oxide layer 12 is exposed and the upper surface of the tungsten plug is about at the same level as the upper surface of the oxide layer 12.

SUMMARY OF THE INVENTION

It is therefore an object of the invention to provide a method of fabricating a barrier layer with low diffusivity and low oxidation.

It is therefore another object of the invention to provide a method of fabricating a barrier layer including a nitride layer but without increasing the complexity of the process.

A method of forming a barrier layer is disclosed. The barrier layer is formed on the upper surface of the tungsten plug. The method of forming the barrier layer is mainly a nitridation reaction. The nitridation reaction makes use of $NH_3$ plasma, $N_2$ plasma and $N^+$implantation.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
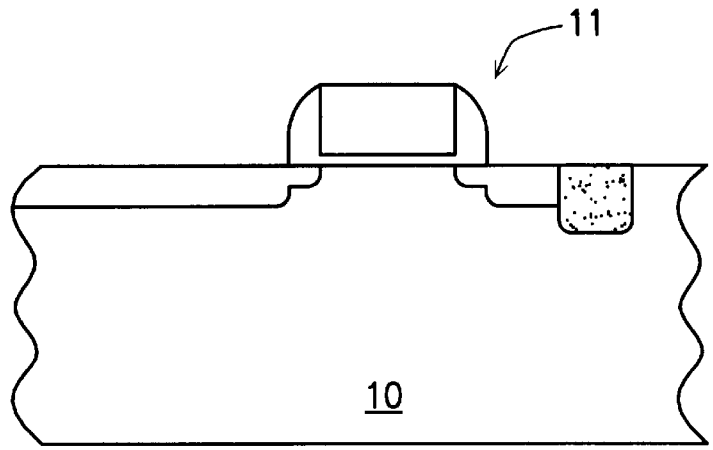
FIGS. 1A to 1C are cross-sectional views showing the conventional process steps of fabricating a barrier layer.
Figure 1B:
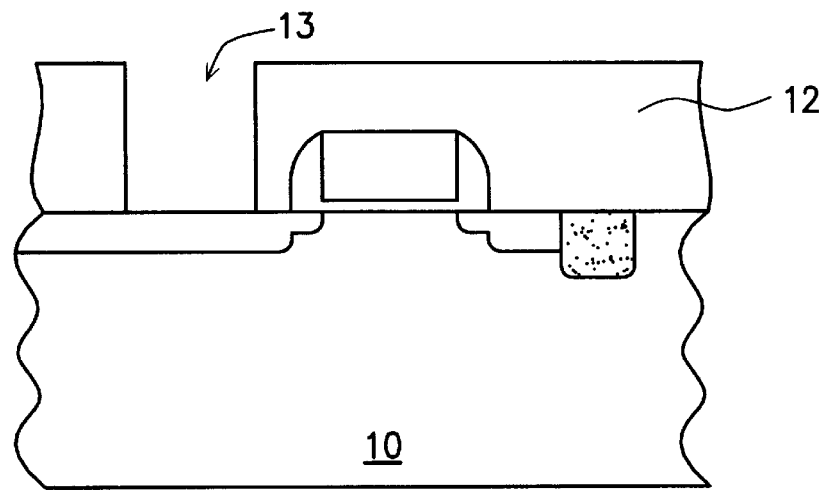
Figure 1C:
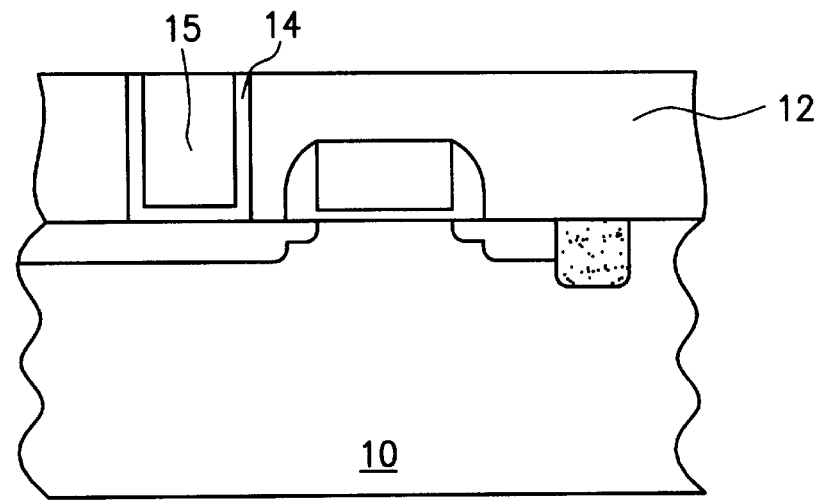
Figure 2A:
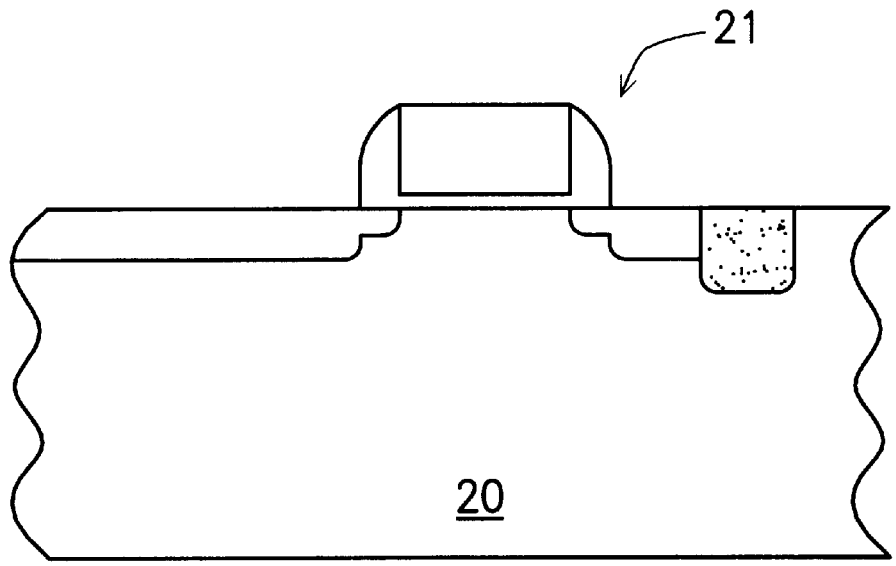
FIGS. 2A to 2D are cross-sectional views showing the process steps of fabricating a barrier layer in accordance with a preferred embodiment of the invention.

Referring to FIG. 2A, a semiconductor device 21 is preferably first formed on a substrate 20. The substrate 20 is preferably a silicon substrate.

Figure 2B:
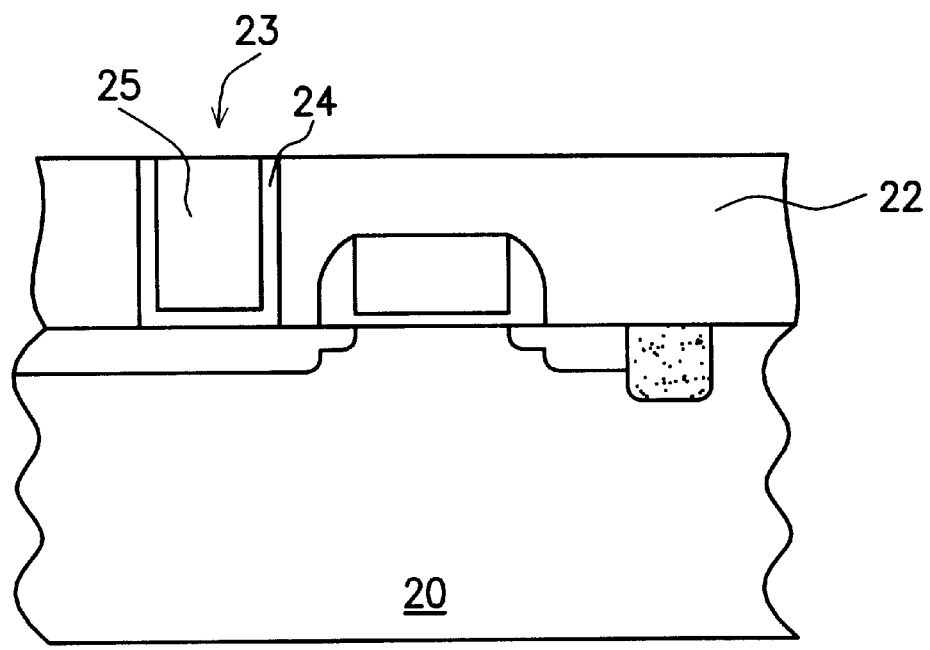

Then, referring to FIG. 2B, an oxide layer 22 is formed preferably by CVD to cover the semiconductor device 21. Then, by performing a photolithography process, the oxide layer 22 is etched to form an opening 23. Then, a barrier layer 24 is formed by physical vapor deposition (PVD) or CVD on the periphery and the bottom of the opening 23. The barrier layer 24 can be made from a material such as TiN. Next, a tungsten layer 25 is deposited by CVD to fill the opening 23 and cover the barrier layer 24. Then, a CMP process is preferably performed to polish the tungsten layer 25 until at least the surface of the oxide layer 22 is exposed so that the upper surface of the oxide layer 22 and the upper surface of the tungsten layer 25 are substantially at the same level. A tungsten plug is therefore formed.

Figure 2C:
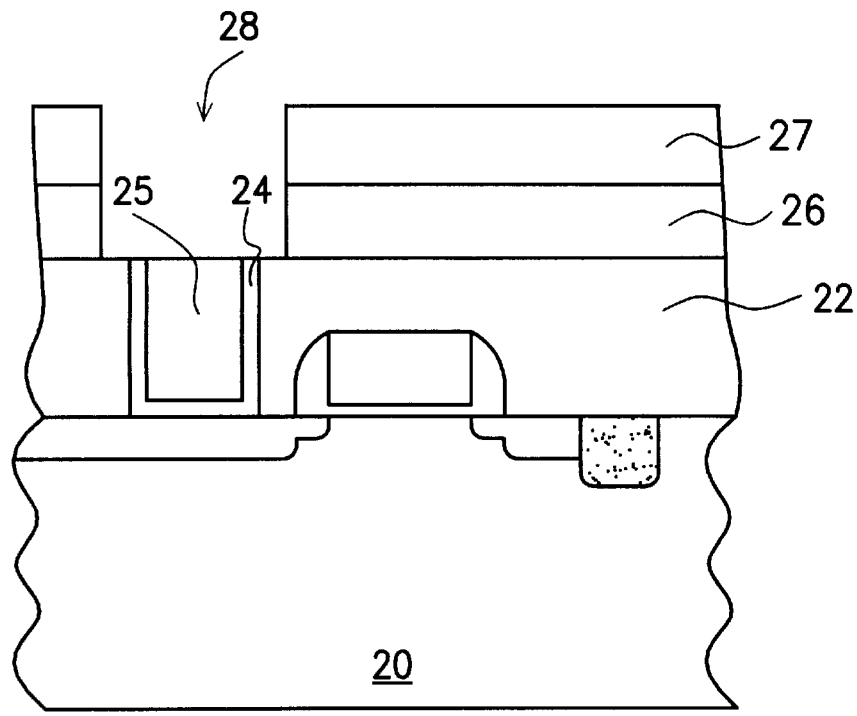

Referring to FIG. 2C, a silicon oxy-flouride layer is formed, preferably by a plasma enhanced chemical vapor deposition (PECVD), to cover the oxide layer 22 and the tungsten plug. The silicon oxy-flouride layer preferably includes fluroinated silicon glass 26 (FSG). Moreover, FSG is characterized by its low dielectric constant of about 3.0, which eliminates the problem of RC time delay. However, FSG has a characteristic of water absorption, which strongly effects the continuous processes. Therefore, an intense and non-water absorption oxide layer 27 is preferably formed, for example, by PECVD, to cover the FSG layer 26. The material of the oxide layer 27 preferably includes silicon oxide. Next, another opening 28 is preferably formed by photolithography and etching to expose the upper surface of the tungsten plug 25. The width of the opening 28 is preferably larger than the width of the opening 23.

Figure 2D:
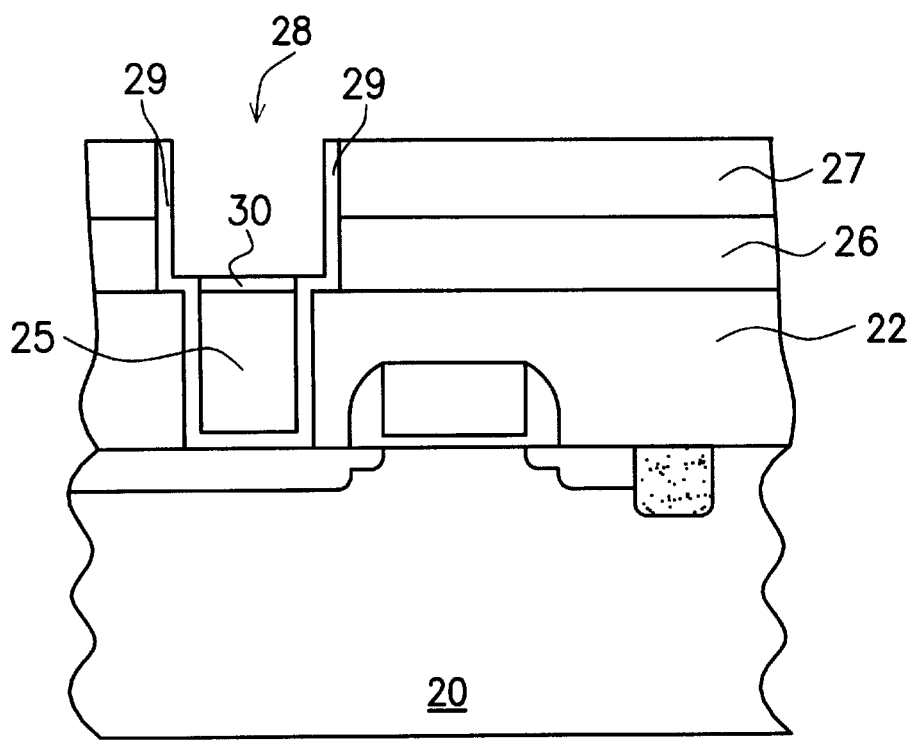

Next, referring to FIG. 2D, a nitridation reaction is performed so that the oxide layer 27 and the FSG layer 26 exposed at the periphery of the opening 28 are partially converted to be a silicon oxy-nitride 29 and the exposed surface of the tungsten plug 25 is converted to be a tungsten nitride layer 30. The nitridation reaction can be performed by, for example, using $NH_3$ plasma, $N_2$ plasma and $N^+$implantation. The silicon oxy-nitride layer 29 and the tungsten nitride layer 30 formed by nitridation provide superior ability for preventing spiking. Moreover, the FSG 26 with the post-nitridation treatment has good moisture resistance. Therefore, there are no problems of fast diffusivity and high oxidation caused by the conventional method while the opening for the copper plug is formed.

While the invention has been described by way of example and in terms of a preferred embodiment, it is to be understood that the invention is not limited thereto. To the contrary, it is intended to cover various modifications and similar arrangements and procedures, such as the formation of a multiple voltage transistor. The scope of the appended claims therefore should be accorded the broadest interpretation so as to encompass all such modifications and similar arrangements and procedures.

What is claimed is:

1. A method of forming a barrier layer, comprising:

providing a substrate, wherein on the substrate, a first opening is formed through a dielectric layer to expose a certain region for contacting and wherein the first opening has a bottom and a periphery;

forming a first barrier layer to at least cover the bottom and the periphery of the first opening;

forming a tungsten layer to at least fill the first opening and to be substantially at the same level of dielectric layer, wherein the tungsten layer has an upper surface;

forming a silicon oxy-fluoride layer over the substrate;

forming an oxide layer on the silicon oxy-fluoride layer;

patterning the oxide layer to form a second opening through the silicon oxy-fluoride layer and the oxide layer, exposing the upper surface of the tungsten layer, wherein the second opening has a periphery; and performing a nitridation reaction to form a first nitride layer on the periphery of the second opening and a second nitride layer on the upper surface of the tungsten layer.

2. A method of claim 1, wherein the certain region is a source/drain region of a metal-oxide semiconductor field effect transistor and therefore the first opening is formed to expose the source/drain region.

3. A method of claim 1, wherein the dielectric layer includes an oxide layer.

4. A method of claim 1, wherein the first barrier layer includes a TiN/Ti layer.

5. A method of claim 1, wherein the tungsten layer is formed by chemical vapor deposition and then etched back by chemical mechanical polishing.

6. A method of claim 1, wherein the oxide layer on the silicon oxy-fluoride layer includes a silicon oxide layer.

7. A method of claim 1, wherein the silicon oxy-fluoride layer is formed by plasma enhanced chemical vapor deposition.

8. A method of claim 1, wherein the oxide layer on the silicon oxy-fluoride layer is formed by plasma enhanced chemical vapor deposition.

9. A method of claim 1, wherein the nitridation reaction is performed so that the first nitride layer includes a silicon oxy-nitride.

10. A method of claim 1, wherein the nitridation reaction is performed so that the second nitride layer includes a tungsten nitride layer.

11. A method of claim 1, wherein the nitridation reaction is performed using $NH_3$ plasma.

12. A method of claim 1, wherein the nitridation reaction is performed using $N_2$ plasma.

13. A method of claim 1, wherein the nitridation reaction is performed by $N^+$implantation.

* * * * *